BILATERAL TRANSISTOR GATE CIRCUIT

Filed Feb. 11, 1966

INVENTORS P. N. BURGESS
R. E. CARDWELL
F. R. REMSKI
BY
Charles Scott Phelan
ATTORNEY United States Patent Office 3,476,956
Patented Nov. 4, 1969

3,476,956

BILATERAL TRANSISTOR GATE CIRCUIT

Paul N. Burgess, Columbus, Ohio, and Robert E. Cardwell, Jamesburg, and Frank R. Remski, Oceanport, N.J., assignors to Bell Telephone Laboratories, Incorporated, New York, N.Y., a corporation of New York Filed Feb. 11, 1966, Ser. No. 526,856
Int. Cl. H03k *17/60*
U.S. Cl. 307—254 6 Claims

ABSTRACT OF THE DISCLOSURE

A switching circuit has two standard junction transistors coupled collector to emitter. A source of bipolar input signals is connected to one emitter, and a load is connected to the other emitter. Gating signals are applied through a multiple connection to both base electrodes for biasing both transistors into conduction at once. Input signals of either polarity are conducted through the collector-emitter paths of both transistors between the source and the load. Varistors are interposed in the collector circuit of each transistor to improve composite current gain.

Figure 1:
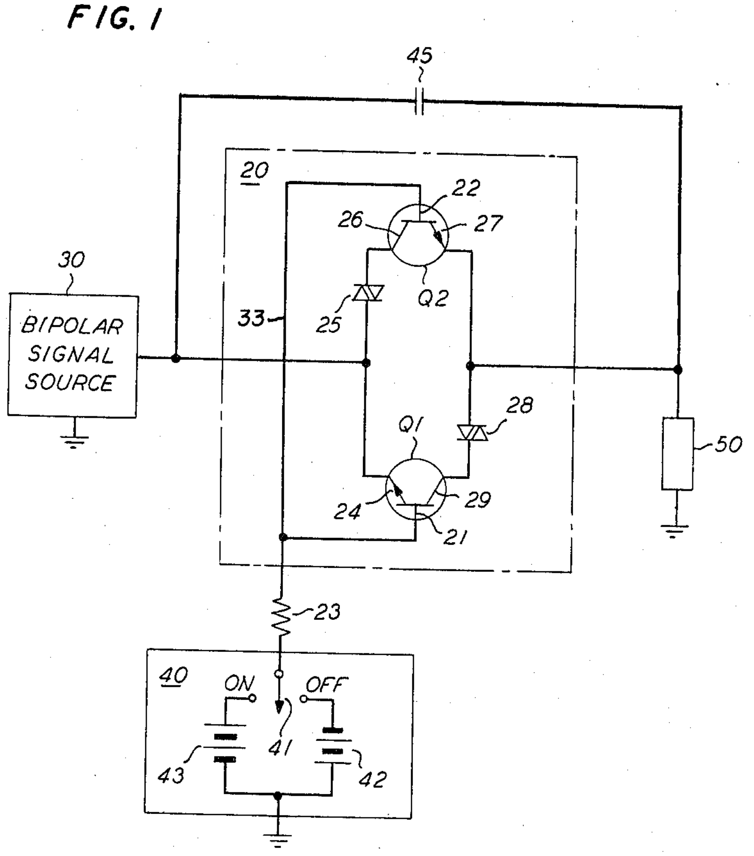

The invention is an electronic switch more particularly described as a compound coupled transistor circuit for selectively blocking and transmitting bipolar electrical signals.

In the prior art, bipolar conduction through transmission gate circuits is accomplished by various techniques. Bipolar signals that are transmitted through a transmission gate usually should be conducted equally well in either direction. The transmission gates described in the prior art do not provide equal conduction in opposite directions except by gate circuits that include either an expensive specially developed component or carefully matched standard components.

For example, bipolar signals can be transmitted by a transmission gate using a standard transistor that is enabled and disabled by control signals applied to its base electrode so that the bipolar signals are enabled to be conducted in either direction through the collector-emitter path between a source and a load. More current is conducted in this path when the transistor is biased in a normal bias mode than when the transistor is biased in an inverted bias mode. In the normal bias mode, a voltage of predetermined magnitude and polarity is applied between the collector and emitter electrodes. In the reverse bias mode, a voltage of the same predetermined magnitude and opposite polarity than the forward bias mode is applied between the collector and emitter electrodes. In each mode the base current has equal magnitude and enabling polarity. These two bias modes produce collector-emitter current of unequal magnitude because the construction of the transistor affects electrical characteristic variations resulting from either the geometrical structure or the diffusion properties of the transistor. A transistor producing unequal currents as previously described has an unsymmetrical current transfer characteristic and is hereinafter referred to as an unsymmetrical transistor. The unsymmetrical transistor does not satisfactorily transmit bipolar signals equally well in either direction.

Bipolar signals can also be transmitted by a transmission gate using a symmetrical transistor that is enabled and disabled by control signals applied to its base electrode. A symmetrical transistor is a solid state device that has two collector-emitter electrodes and a base electrode. The collector-emitter electrodes are built symmetrically with respect to the base electrode so that the device conducts equal current in either direction through its collector-emitter path when the transistor is biased to conduct with collector-emitter bias and base current each having a predetermined magnitude. Symmetrical transistors therefore have symmetrical current transfer characteristics. Unfortunately, symmetrical transistors have been relatively expensive compared to standard transistors because each symmetrical transistor must conform to emitter and collector geometry tolerances that are difficult to meet by presently known manufacturing methods. Although symmetrical transistors satisfactorily transmit bipolar signals, they cost too much for use on a large scale.

Bipolar signals can additionally be transmitted by unsymmetrical transistors arranged in a push-pull circuit that includes two transistors coupled by transformer coils with only one transistor biased to conduct through its collector-emitter path for each polarity of signal while the other transistor is cut off. Only when the two transistors are specially selected to have identical forward current transfer characteristics, does a push-pull circuit conduct equal current from a source to a load and vice versa for collector-emitter bias and base current having predetermined magnitudes. Even though push-pull circuits provide good bipolar conduction by using unsymmetrical transistors, the cost of an operable circuit is increased by the necessary selection of components and by the inclusion of transformers.

It is an object of this invention to reduce the cost of a transmission gate that provides equal conduction of message signals of both positive and negative polarity.

This and other objects of the invention are realized in an illustrative embodiment thereof which is a bilaterally conducting transistor circuit that conducts message signals equally well in either one of two directions in response to the coincidence of an enabling control signal and bipolar message signals. In this embodiment, two unsymmetrical junction transistors are compound coupled collector to emitter, a source of bipolar input signals is connected to one emitter, a load is connected to the other emitter, and control signals are applied in multiple to both base electrodes to enable the two transistors so that they conduct the bipolar input signals through the collector-emitter paths of both transistors to the load.

A feature of the invention is a transistor circuit having unsymmetrical transistors compound coupled collector to emitter so that control signals applied in multiple to their base electrodes enable the transistors to equally transmit signals of either polarity through their composite collector-emitter circuit.

Another feature of the invention is the insertion of varistors in the collector leads of two unsymmetrical transistors compound coupled collector to emitter for improving the composite current gain of the transistor circuit.

Another feature of the invention is a means for applying control signals in multiple to the base electrodes of two unsymmetrical transistors compound coupled collector to emitter.

A further feature of the invention is a nonmagnetic means for controlling the coupling of bipolar message signals from a source to a load.

A still further feature of the invention is the controlled by-passing of message signals around a capacitor coupling a source to a load by means of the combined collector-emitter paths of a transistor circuit having unsymmetrical transistors compound coupled collector to emitter.

Figure 2:
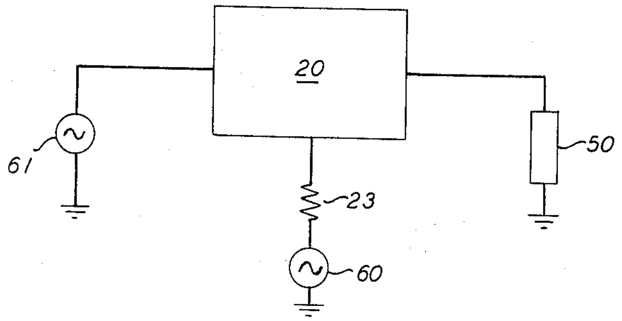

A better understanding of the invention may be derived from the detailed description following when that description is considered together with the attached drawing in which:

FIG. 1 is a schematic diagram of a particular embodiment of a compound coupled transistor circuit in accordance with the invention; and FIG. 2 is a schematic diagram of another embodiment of the invention.

In FIG. 1, a compound coupled transistor circuit 20 includes a first NPN transistor Q1 and a second NPN transistor Q2 that couple signals from a bipolar signal source 30 to a load 50 when enabling signals applied by a control signal source 40 enable the circuit. The transistors Q1 and Q2 are both unsymmetrical transistors that have a greater current transfer ratio when operated in a normal bias mode than when they are operated in an inverted bias mode. A normal bias mode is the biasing of a transistor to conduct in the usual manner. An inverted bias mode is the biasing of a transistor to conduct with its collector and emitter biases interchanged so that the collector acts like an emitter and vice versa. A base electrode 21 of the transistor Q1 is connected by a lead 33 to a base electrode 22 of the transistor Q2, and the lead 33 is coupled through a current limiting resistor 23 to the control signal source 40. An emitter electrode 24 of the transistor Q1 is coupled through a varistor 25 to a collector electrode 26 of the transistor Q2. The emitter electrode 24 is connected to the bipolar signal source 30 from which bipolar analog message signals are applied to the emitter electrode 24. An emitter electrode 27 of the transistor Q2 is coupled through a varistor 28 to a collector electrode 29 of the transistor Q1. The emitter electrode 27 is connected to the load 50 for transmitting bipolar analog message signals from the circuit 20 to the load 50. The load 50, a suitable bilateral device, is connected to a source of reference potential illustratively shown as ground so that it will respond to bipolar signals transmitted through the circuit 20. The varistors 25 and 28 are bilateral diode devices having a voltage-dependent nonlinear resistance that is markedly reduced as applied voltage is increased. The voltage drop across these varistors can be considered to be fixed in either direction whenever they conduct substantially.

The bipolar signal source 30, which is connected to ground, produces bipolar analog or digital message signals that are transmitted bilaterally through the circuit 20 when an enabling signal is applied to the base electrodes 21 and 22 by the control signal source 40.

The control signal source 40 is illustratively shown as a double-throw switch 41 having ON and OFF positions for respectively applying enabling and disabling signals to the base electrodes 21 and 22. In the OFF position, the switch 41 couples a source of negative polarity potential 42 to the base electrodes 21 and 22 for disabling the transistor circuit 20. In the ON position, the switch 41 couples a source of positive polarity potential 43 to the base electrodes 21 and 22 for enabling the circuit 20 to conduct in saturation in either direction between the bipolar signal source 30 and the load 50. The configuration of the control signal source 40 is not limited to a double-throw switch and batteries as shown but includes any source that produces enabling and disabling signals.

In operation, the control signal source 40 disables the circuit 20 by applying to the base electrodes 21 and 22 a negative potential signal of sufficient amplitude so that all of the junctions of the transistors are reverse biased and neither transistor conducts. When the circuit 20 is disabled, it produces a high impedance between the signal source 30 and the load 50 so that message signals from the bipolar signal source 30 are blocked from reaching the load 50.

When the control signal source 40 is ON, one of the transistors is enabled to conduct in a normal bias mode and the other transistor is enabled to conduct in an inverted bias mode. These bias modes are interchanged from one transistor to the other by a change of polarity of the input signal. While the circuit 20 is enabled, a positive polarity message signal from the signal source 30 biases both transistors so that they conduct current to the load 50. The transistor Q2 operates saturated in its normal bias mode and the transistor Q1 operates in its inverted bias mode by drawing some base current through its base-collector path. Additionally, while the circuit 20 is enabled, a negative polarity message signal biases the transistors to conduct current from the load 50 toward the signal source 30. The bias modes of the transistors are interchanged for negative polarity message signals so that the transistor Q1 operates saturated in its normal bias mode and the transistor Q2 operates in its inverted bias mode. Because the current applied to the base electrodes 21 and 22 is limited by the resistor 23, the current drawn by the combination of the base circuits is constant and it divides between the bases in accordance with the needs of the transistors for the mode of circuit operation. The transistor circuit 20 can be operated without the varistors, but the varistors are usually inserted because they increase the composite current gain of the circuit 20 and thereby accomplish an advantage previously accomplished by transformer coupling.

Assuming that a positive polarity signal is applied by signal source 30, the varistor 28 limits the emitter-collector conduction of the transistor Q1 by decreasing its effective collector junction potential without removing the transistor Q2 from saturated operation in its normal bias mode. Reducing the conduction of the transistor Q1 reduces the current drain on the control signal by the base 21 so that the base 22 of the transistor Q2 takes most of the current available from the control source 40. The transistor Q2 takes enough of the current from the source 40 that a substantial composite current gain is realized for the combination of the transistors. The varistor 25 similarly helps produce a substantial composite current gain for the combination when a negative polarity signal is applied by the signal source 30.

Assume additionally that the transistor Q2 has a normal current gain, $\beta_{N2}$, slightly greater than the normal current gain, $\beta_{N1}$, of the transistor Q1. Usually for transistors of the same type, if $\beta_{N2}$ is slightly greater than $\beta_{N1}$, the transistor Q1 has an inverted current gain, $\beta_{I1}$, slightly larger than the inverted current gain, $\beta_{I2}$, of the transistor Q2. When the transistor Q1 is operated in its inverted bias mode, the base 21 takes more current than the base 22 does when the transistor Q2 is operated in its inverted bias mode. By taking different amounts of base current in their inverted bias modes the two transistors tend to compensate for $\beta_{N2}$ being greater than $\beta_{N1}$ so that the composite current gain for the circuit 20 is essentially equal for either polarity of signal from the signal source 30. A low impedance approximately equal in magnitude for either polarity input signal is therefore produced between the signal source 30 and the load 50 when the circuit 20 is enabled. The addition of the varistor in the collector lead of each transistor simplifies the process of transistor selection because transistors paired by similar forward current transfer characteristics produce substantial and essentially equal composite current gain for either polarity of input signal. The need for transformer coupling of the transistors is eliminated by the substantial composite current gain that is produced.

The previous description discloses a compound coupled transistor circuit that is enabled to conduct equally well in either direction through its combined collector-emitter paths in response to control signals of one polarity applied in multiple to the base electrodes of the transistors and is disabled in response to control signals of opposite polarity. When there are no varistors in the circuit 20 and the circuit is conducting, the circuit conducts in either direction through its combined collector-emitter paths but there is a higher impedance to current than when the varistors are inserted. Unilaterally conducting diodes are also operative in the circuit 20 in place of the varistors. The diodes must be poled to conduct current when the associated transistor is conducting. The diodes help produce a substantial current gain and help reduce the impedance between the bipolar signal source and the load, but they also reduce the compensating action of a transistor operating in an inverted bias mode.

In a particular use of this invention in a data receiver, a capacitor 45 is inserted between the bipolar signal source 30 and the load 50 for coupling signals from the source to the load whenever the circuit 20 is disabled because A-C coupling is desirable when the circuit is disabled and D-C coupling is desirable when the circuit is enabled. In the data receiver the bipolar signal source 30 is a demodulator, the load 50 is a slicer, and the control signal source 40 is a carrier detector. The carrier detector actuates an enabling signal for a short time commencing with an initial bipolar signal transition from the demodulator. The transistor circuit couples the demodulator to the slicer for the initial transition, which is substantially smaller in amplitude than subsequent transitions, because the capacitor provides insufficient coupling of the smaller transition to properly operate the slicer. After the initial signal transition is coupled through the transistor circuit, that circuit is disabled so that subsequent full amplitude signal transitions are coupled through the capacitor to the slicer.

In FIG. 2 there is shown another embodiment of the invention including an alternating potential control signal source 60 having a predetermined signal frequency and an alternating potential input signal source 61 having the same predetermined signal frequency. The sources 60 and 61 respectively replace the control signal source 40 and the bipolar signal source 30 previously described. When the invention is used in this embodiment, it operates as a phase detector for detecting the difference between the phase of signals from the input signal source 61 and the phase of signals from the control source 60. During an input signal period there are produced across the load 50 output signals having an average value that is a function of the difference between the phase of the input signals and the phase of the control signals. The function of the value of the output signal may be better understood by considering two similar sine waves, one used as an input signal and the other used as a control signal. The input signal is conducted through the circuit 20 only during each half cycle that the control signal has a positive value. As the phase angle between the signals is changed, the conducted portion of the input signal changes and produces a variable output signal having an average value that is dependent upon the difference in phase of the two signals. The average value of the output signal has a maximum positive value when the signals are in phase, a value of zero when the signals are 90° out of phase, and a maximum negative value when the signals are 180° out of phase.

The above-detailed description is by way of illustration of two embodiments of the invention and it is understood that other embodiments will be obvious to those skilled in the art. These additional embodiments are considered to be within the scope of the invention.

What is claimed is:

1. A circuit comprising first and second transistors each having base, emitter, and collector electrodes, first varistor means producing a limited voltage drop thereacross in either direction and coupling the collector electrode of the first transistor to the emitter electrode of the second transistor, second varistor means producing a limited voltage drop thereacross in either direction and coupling the collector electrode of the second transistor to the emitter electrode of the first transistor, a direct connection between the base electrode of the first transistor and the base electrode of the second transistor, a control signal source coupled to the base electrodes of the first and second transistors for applying control signals to the transistors, a load having a terminal connected between the second varistor means and the emitter electrode of the first transistor, and a bipolar message signal source having a terminal connected between the first varistor means and the emitter electrode of the second transistor for biasing the transistors to conduct a first current toward the load in response to a first polarity message signal and to conduct a second current away from the load in response to a second polarity message signal.

2. A circuit in accordance with claim 1 comprising a capacitor coupling the emitter electrode of the first transistor to the emitter electrode of the second transistor.

3. A circuit in accordance with claim 1 in which the first and second transistors each have a normal bias mode output characteristic that is unsymmetrical with respect to its inverted bias mode output characteristic.

4. A circuit in accordance with claim 3 in which the first varistor reduces the collector junction potential on the first transistor while that transistor is operating in its inverted bias mode, and the second varistor reduces the collector junction potential on the second transistor while that transistor is operating in its inverted bias mode.

5. A circuit in accordance with claim 4 in which the control signal source produces a first control signal of the first polarity to enable the transistors and a second control signal of the second polarity to disable the transistors.

6. A circuit in accordance with claim 5 in which the first control signal has sufficient amplitude so that message signals cannot remove the circuit from saturated operation, and the second control signal has sufficient amplitude so that message signals cannot bias the transistors into conduction.

References Cited

UNITED STATES PATENTS

| | | | |
|---|---|---|---|
| 2,728,857 | 12/1955 | Sziklai | 307—250 X |
| 2,891,171 | 6/1959 | Shockley | 307—249 X |
| 2,972,685 | 2/1961 | Baude | 307—254 |
| 3,025,418 | 3/1962 | Brahm | 307—252 |
| 3,064,142 | 11/1962 | Nahay | 307—232 X |
| 3,215,858 | 11/1965 | Harding et al. | 307—254 X |
| 3,289,013 | 11/1966 | Gallant et al. | 307—253 X |
| 3,289,086 | 11/1966 | Hallquist et al. | 307—232 X |
| 3,315,094 | 4/1967 | Mills | 307—237 |

DONALD D. FORRER, Primary Examiner

J. D. FREW, Assistant Examiner

U.S. Cl. X.R.

407—232, 242, 250, 317